(12) United States Patent
Bohmer et al.

(10) Patent No.: US 10,761,246 B2
(45) Date of Patent: Sep. 1, 2020

(54) LIGHT EMITTING SEMICONDUCTOR DEVICE HAVING POLYMER-FILLED SUB-MICRON PORES IN POROUS STRUCTURE TO TUNE LIGHT SCATTERING

(71) Applicant: Lumileds LLC, San Jose, CA (US)

(72) Inventors: Marcel Rene Bohmer, Eindhoven (NL); Jacobus Johannes Franciscus Gerardus Heuts, Eindhoven (NL); Daniel Estrada, Santa Cruz, CA (US); Kentaro Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 311 days.

(21) Appl. No.: 15/852,822

(22) Filed: Dec. 22, 2017

(65) Prior Publication Data

US 2019/0196069 A1    Jun. 27, 2019

(51) Int. Cl.
  *G02B 5/02* (2006.01)
  *H01L 33/58* (2010.01)
  *H01L 33/50* (2010.01)

(52) U.S. Cl.
  CPC ......... *G02B 5/0247* (2013.01); *G02B 5/0268* (2013.01); *G02B 5/0278* (2013.01);
  (Continued)

(58) Field of Classification Search
  CPC .. G02B 5/0242; G02B 5/0247; G02B 5/0268; G02B 5/0278; G02B 5/0294;
  (Continued)

(56) References Cited

U.S. PATENT DOCUMENTS

| | | | |
|---|---|---|---|
| 2005/0106377 A1* | 5/2005 | Koestner | C08J 7/047 428/304.4 |
| 2006/0060882 A1 | 3/2006 | Ohe et al. | |
| 2013/0215512 A1 | 8/2013 | Coggio et al. | |
| 2015/0346397 A1* | 12/2015 | Linkov | G02B 5/0242 257/98 |

(Continued)

OTHER PUBLICATIONS

Schott, "Schott CoralPor® Porous Glass Product Information," Available at: http://www.us.schott.com/d/corporate/97a9fte5-1776-4264-87b8-afe7bd7d9587/1.3/06.12.13-final-datasheet-coralpor-porous-glass-new.pdf?highlighted_text=coralpor (2013).

(Continued)

*Primary Examiner* — Ryan S Dunning (57) ABSTRACT

Described herein is a system and method for tuning light scatter in an optically functional porous layer of an LED. The layer comprises a non-light absorbing material structure having a plurality of sub-micron pores and a polymer matrix. The non-light absorbing material forms either a plurality of micron-sized porous particles dispersed throughout the layer or a mesh slab, wherein a plurality of sub-micron pores is located within each micron-sized porous particle or forms an interconnected network of sub-micron pores within the mesh slab, respectively. A polymer matrix, such as a high refractive index silicone fills the plurality of sub-micron pores creating an interface between the materials. Refractive index differences between the materials allow for light scatter to occur at the interface of the materials. Light scatter can also be decreased as a function of temperature, creating a system for tuning light scatter in both an off state and on state of an LED.

17 Claims, 7 Drawing Sheets

(52) U.S. Cl.
CPC .............. *H01L 33/50* (2013.01); *H01L 33/58* (2013.01); *G02B 5/0242* (2013.01); *G02B 2207/107* (2013.01); *H01L 2933/0058* (2013.01); *H01L 2933/0091* (2013.01)

(58) Field of Classification Search
CPC ............ G02B 2207/107; G02B 6/0016; G02B 6/0025; G02B 6/0026; G02B 6/004; G02B 6/0041; G02B 6/0051; G02B 6/0073; H01L 33/50–508; H01L 33/58; H01L 51/5268; H01L 2933/0041; H01L 2933/0058; H01L 2933/0091
USPC ...................... 257/79, 80, 98, 103; 359/599; 362/23.07–23.13, 612, 555, 545, 800
See application file for complete search history.

(56) References Cited

U.S. PATENT DOCUMENTS

| | | |
|---|---|---|
| 2016/0109099 A1 | 4/2016 | Okuno |
| 2016/0260873 A1 | 9/2016 | Yamada et al. |
| 2018/0062052 A1 | 3/2018 | Bohmer et al. |
| 2018/0097158 A1 | 4/2018 | Estrada et al. |

OTHER PUBLICATIONS

Grace, "DAVISIL® Chromatographic Silica," Brochure, Available at: https://grace.com/food-and-beverage/en-US/Documents/Davisil_Brochure.pdf (2016).

\* cited by examiner

LIGHT EMITTING SEMICONDUCTOR DEVICE HAVING POLYMER-FILLED SUB-MICRON PORES IN POROUS STRUCTURE TO TUNE LIGHT SCATTERING

BACKGROUND

Light emitting diodes may be used as white light sources in various applications, such as flash sources for cellular telephone cameras and filament lamps. Such LEDs may be referred to herein as white LEDs.

White LEDs may appear to emit white light from the perspective of the viewer when the LEDs are in an on state. However, they may actually be made up of light emitting semiconductor structures that emit non-white light, as well as wavelength converting structures that make the non-white light appear white to the viewer. For example, a white LED may be formed from a blue light emitting semiconductor structure covered by a yellow emitting phosphor layer. Photons of blue light emitted by the light emitting semiconductor structure may either pass through the yellow emitting phosphor layer as blue photons or may be converted into yellow photons by the yellow emitting phosphor layer. The blue and yellow photons that are ultimately emitted out of the LED combine to make the light emitted from the LED appear white to the viewer.

LEDs can also be used across a range of dimtone settings. However, an LED that appears to emit cooler light at a high dimtone setting for example, may also appear to emit cooler at a low dimtone setting. Likewise, an LED that appears to emit warmer light at a low dimtone setting for example, may also appear to emit warmer at a high dimtone setting.

SUMMARY

An optically functional porous structure for use in LEDs, and a method of making such an optically functional porous structure are described herein. The optically functional porous structure comprises a non-light absorbing material structure, which may be a dielectric structure, comprising a plurality of sub-micron pores and a polymer matrix. The non-light absorbing material structure itself may be comprised of a plurality of micron-sized porous particles. Further, the refractive index of the non-light absorbing material structure is different than a refractive index of the polymer matrix at a first temperature such that a refractive index difference between the refractive index of the non-light absorbing material structure and the refractive index of the polymer matrix configures the plurality of sub-micron pores within the optically functional porous structure to have a light scattering ability at the first temperature. Because the refractive index difference between the refractive index of the non-light absorbing material structure and the refractive index of the polymer matrix decreases as the temperature changes, the light scattering ability of the plurality of sub-micron pores also varies with these corresponding changes in temperature.

DETAILED DESCRIPTION OF THE PREFERRED EMBODIMENTS

While white LEDs may appear to emit white light in the on state, such LEDs may appear to be the color of the wavelength converting material when turned off. For example, a white LED that includes a yellow emitting phosphor layer may appear yellow or green to a viewer when turned off, such as when being viewed on a store shelf. Nevertheless, an ordinary consumer may expect a product that includes a white LED to appear white even in the off state. For example, a person who walks into a store to purchase a white light bulb will usually expect the white light bulb to actually appear white and may think that the light bulb is defective if it appears yellow or green. The same may be true of a cellular telephone consumer who may expect the camera flash to appear white. Such products would be more marketable to the consumer if the LED appeared white in the off state as well as in the on state.

Changes in color point of an LED light may also be preferred. For example, when LED lights are dimmed, a user may prefer to observe warmer colors at these lower dimtone settings. Conversely, when LED lights are bright, a user may prefer to observe cooler colors. By increasing the drive current, which leads to an increase temperature, a change in the color point will occur if changes in light scattering are correlated with changes in temperature. This is in part because blue light, for example, scatters light more strongly than red light; therefore, by changing the relative amount of blue light that is scattered relative to the amount of red light that is scattered may change the color point of the perceived light emitted from the LED.

To provide an off state white appearance for LEDs in the off state, or to provide warmer colors when lights are dimmed, granules of white, non-phosphor, inert materials have been used. These granules are often sub-micron sized granules because particles of this size may function as particularly effective light scattering elements. Examples of such materials include Titanium Dioxide ($TiO_2$) and Zirconium Oxide ($ZrO_2$). Sub-micron size particles of these materials may be mixed in with a transparent material, such as silicone, and applied over a non-white LED surface to make it appear whiter to a viewer in the LED off state for example. However, such granules of white, non-phosphor, inert materials may remain white while the device is on and may result in some scattering of light emitted from the LED in the on state, reducing the LED's lumen output.

In these examples, the magnitude of light scattering in either state depends on the concentration of the sub-micron particles in optically functional layer, and on the refractive index difference between the sub-micron particles and the transparent material. With regard to the former, an increase in the concentration of the sub-micron particles may increase light scattering in the off state. However, as the concentration of these particles increases, this may lead to a decrease in the LED's lumen output in the on state. In addition, there may be issues in processing the materials. For example, mixing the materials becomes increasingly difficult as the viscosity of the mixture increases with increasing concentration of sub-micron particles. Another issue may be that the final layer is too brittle due to high particle loading.

With regard to the refractive index difference between the refractive index of the sub-micron particle and the refractive index of the transparent layer, it must be great enough so that sufficient light scattering from the sub-micron particles may occur. Conversely, the refractive index difference must not be too great such that light scattering does not occur at all temperatures within the possible range of use. For example, if the refractive index of the transparent layer were so high compared with the refractive index of the sub-micron particle, then a decrease in the refractive index of the transparent layer may not sufficiently approach the refractive index of the sub-micron particle and light scattering would occur across all temperatures in the range of use.

Because the temperature of an LED may increase in the on state relative to the off state, and because increased light scattering may reduce the LED's lumen output, it would be ideal to have light scattering decrease with an increase in temperature. As described in the foregoing, the most commonly used scattering particle is $TiO_2$. However, the refractive index of $TiO_2$ is high while that of silicone, a commonly used transparent layer material is lower, wherein the refractive index difference between them is more than 0.5. An increase in temperature using this combination of materials may result in an even greater refractive difference between $TiO_2$ and silicone, causing even greater light scatter in the on state. Accordingly, using a scattering particle having a lower refractive index relative to the transparent material may be better suited.

An example of such a particle is $MgF_2$, which has a refractive index of 1.37. Its refractive index is smaller than, but close to that of a high refractive index silicone, which may have a refractive index of 1.55 However, because the refractive index difference between the two materials is only 0.16, much greater concentrations of $MgF_2$ would be required to achieve sufficient light scatter in the off state, which may lead to issues in processing the materials as described in the foregoing.

Embodiments described herein provide for a white LED that may appear white to the viewer in both the LED on and off states, yet also reduce or eliminate scattering in the LED on state, making products that include such LEDs more aesthetically pleasing to the viewer without impacting the quality of the LED itself or the structure of its materials. Embodiments described herein may also provide for an LED light whereby the color point can be adjusted such that at a low dimtone setting, the color point shifts to warmer colors, while at a high dimtone setting, the color point shifts to cooler colors. Such embodiments may rely on the refractive index difference between the refractive index of a transparent material, which may be a polymer matrix, and the refractive index of the non-light absorbing material, which may be a dielectric material.

In an embodiment, the non-light absorbing material structure itself may be comprised of micron-sized porous particles dispersed throughout the optically functional layer, wherein the micron-sized porous particles comprise a network of interconnected sub-micron pores within the particle itself. In an embodiment, the non-light absorbing material structure may instead be comprised of a mesh slab of porous dielectric material that itself comprises the network of the sub-micron pores. In each case the sub-micron pores are filled with the polymer matrix forming an interface between the polymer matrix and the non-light absorbing material in the shape of a sub-micron pore. This, in combination with the different temperatures of the LED in the on state versus the off state, or at low intensity versus high intensity, wherein the refractive index of the materials described herein may change as a function of temperature, are relied upon to form an LED with properties disclosed herein.

In an embodiment, the refractive index of the polymer matrix is greater than the refractive index of the non-light absorbing material structure in the LED off state, allowing for a light scattering effect to occur at the interface between the two materials. However, in the LED on state, as the temperature increases, the refractive index of the polymer matrix decreases such that the refractive index difference between the non-light absorbing material, which outlines the shape of the sub-micron pores, and that of the polymer matrix, which fills the sub-micron pores, decreases resulting in decreased to no light scattering by the non-light absorbing material to sub-micron pores interface. These features may provide for an LED light that scatters light and appears white at a lower temperature such as room temperature when the LED is in the off state, and that does not scatter light or at least decreases the amount of light scattered, when the LED is in the on state at a higher temperature, which may translate into an increase in the output of the LED light.

These refractive index properties may also provide for an LED that upon a change in intensity changes light scatter. For example, when the intensity of the LED is high, temperature may increase and scattering of light may decrease correspondingly. This may allow for a change in the color point setting of an LED light. For example, blue light, which contributes to cooler tones of light and which is scattered more strongly than red light, may be impacted more by these changes in temperature and light scattering ability. In this instance, an increase in temperature, which may decrease light scatter, may result in more blue light being detected causing a shift in the color point to cooler colors. Conversely, when the intensity of the LED is low, temperature may decrease and scattering of light may increase correspondingly. In this example, the decrease in temperature and increase in light scatter may result in less blue light being detected causing a shift in the color point to warmer colors.

In an embodiment, the refractive index of the non-light absorbing material is greater than the refractive index of the polymer matrix such that an increase in temperature decreases light scatter. This may impair a change in the color point setting of an LED light. This embodiment may be used at least for example to prevent or minimize a color shift that would otherwise occur that is undesirable as the temperature increases. By increasing light scatter as the temperature increases allows for a decrease in color change. This embodiment may also be used to shift the color point to warmer colors as higher temperatures.

In an embodiment, the non-light absorbing material structure itself may be comprised of a plurality of micron-sized porous particles that comprise a network of the sub-micron pores which are dispersed throughout. Alternatively, the non-light absorbing material structure may be comprised of a mesh slab of porous dielectric material that itself comprises the network of the sub-micron pores. In each of these embodiments, the sub-micron pores are filled with the polymer matrix forming an interface between the polymer matrix and the non-light absorbing material structure in roughly the shape of a sub-micron pore.

In each of these embodiments, the refractive index of the polymer matrix is greater than the refractive index of the non-light absorbing material structure in the LED off state, allowing for a light scattering effect to occur at the interface between the two materials. However, in the LED on state, as the temperature increases, the refractive index of the polymer matrix decreases such that the refractive index difference between the non-light absorbing material, which outlines the shape of the sub-micron pores, and that of the polymer matrix, which fills the sub-micron pores, decreases thereby resulting in decreased to no light scattering by the sub-micron pores-dielectric surface interface. These same inherent properties of the materials also allow for a change in the color point setting of an LED light. For example, at low intensity the LED light may shift towards warmer tones and at high intensity the LED light may shift towards cooler tones.

Although the refractive index of the non-light absorbing material may also decrease in response to increased temperature, the change in the refractive index between a first temperature and a second temperature is low relative to the change in the refractive index of the polymer matrix at the first and second temperature. Solid materials, such as the non-light absorbing material, have a much lower expansion coefficient, and therefore a much smaller change in refractive index as a function of temperature than silicone for example. Accordingly, changes in temperature have a greater effect on the refractive index of a polymer matrix than on non-light absorbing materials. More details regarding the polymer matrix and the non-light absorbing material are described below and shown in FIG. 2.

With further regard to the refractive index difference between the two materials, in order to achieve sufficient light scatter in the off state the difference between the refractive index of each material needs to be a certain minimum. Notably, this minimum can be affected by factors such as the concentration of light scattering particles within the optically functional layer. For example, with a smaller difference in the refractive index between materials, a greater concentration of light scattering particles can help to compensate for the relatively small difference in refractive indexes between materials to achieve greater levels of light scatter than at an equivalent refractive index difference with lower concentration of light scattering particles. However, there are limits to the concentration of particles that can be placed within the layer without compensating its form. Conversely, in order to sufficiently reduce light scatter in the on state the difference between the refractive index of each material can only be a certain maximum. If the refractive index difference between the two materials is too great and cannot be sufficiently decreased within any reasonable temperature change, a functionally effective decrease in light scatter cannot occur in the on state.

In an embodiment, the refractive index difference between the refractive index of the non-light absorbing material and the refractive index of the polymer matrix is 0.3 or less. In an embodiment, the refractive index difference between the refractive index of the non-light absorbing material and the refractive index of the polymer matrix is 0.2 or less. In an embodiment, the refractive index difference between the refractive index of the non-light absorbing material and the refractive index of the polymer matrix is 0.1 or less. In an exemplary embodiment, the refractive index difference between the refractive index of the non-light absorbing material and the refractive index of the polymer matrix is 0.07.

The features described herein, provide for an LED that scatters light and appears white at room temperature when the LED is in the off state, and that does not scatter light or decreases the amount of light scattered, when the LED is in the on state. Other embodiments, such as adjusting the color point are described herein and rely on the same principles of differences in refractive index and changes in the refractive indexes as a function of temperature.

Figure 1A:
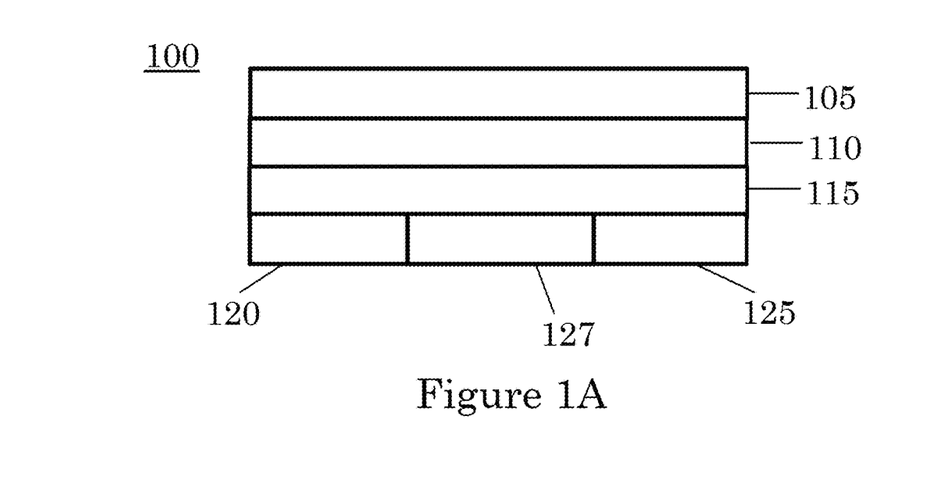
FIG. 1A is a diagram of an example light emitting device (LED) that includes a light emitting semiconductor structure and an off state white material layer.

FIG. 1A is a diagram of an example light emitting device (LED) 100 that includes a light emitting semiconductor structure 115, a wavelength converting material 110, and an off state white material, which may be an optically functional porous structure 105 comprising a plurality of micron-sized porous particles or mesh slab comprising sub-micron pores. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The contacts or interconnects 120 and 125 may be, for example, solder, stud bumps, or gold layers. The optically functional porous structure 105 comprising the plurality of micron-sized porous particles, or mesh slab comprising sub-micron pores, is in contact with the LED.

In an embodiment, the light emitting semiconductor structure 115 emits blue light. In such embodiments, the wavelength conversion material 110 may include, for example, a yellow emitting wavelength conversion material or green and red emitting wavelength conversion materials, which will produce white light when the light emitted by the respective phosphors combines with the blue light emitted by the light emitting structure 115. In other embodiments, the light emitting semiconductor structure 115 emits UV light. In such embodiments, the wavelength conversion material 110 may include, for example, blue and yellow wavelength converting materials or blue, green, and red wavelength converting materials. Wavelength converting materials emitting other colors of light may be added to tailor the spectrum of light emitted from the LED 100. In an embodiment, the color point of this LED 100 may be shifted based on the properties of the optically functional porous structure 105 described herein.

Figure 1B:
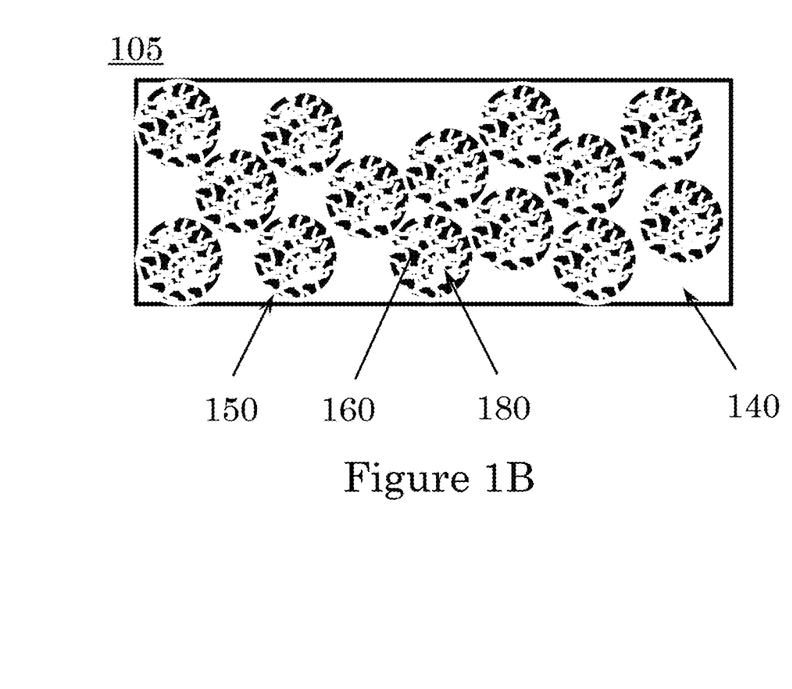
FIG. 1B is a diagram of an exemplary off state white layer comprised of micron-sized porous particles having an interconnected of sub-micron pores filled with a polymer matrix.

FIG. 1B is a diagram of a magnified view of an embodiment of the optically functional porous structure 105, wherein the optically functional porous structure 105 comprises a plurality of micron-sized porous particles 150. Dispersed throughout each micron-sized porous particle 150 is a network of sub-micron pores 165 (shown in FIG. 2), which in this illustration are filled with a polymer matrix 180 (shown in white). The plurality of sub-micron pores 165 form an interconnected network surrounded by the non-light absorbing material 160 (shown in white). In an embodiment, the micron-sized porous particle 150 may be a micron-sized porous glass bead particle. In an exemplary embodiment, the micron-sized porous particle 150 may be a micron-sized porous silica particle. In an embodiment, the micron-sized porous particle 150 is a micron-sized porous magnesium fluoride particle.

Figure 1C:
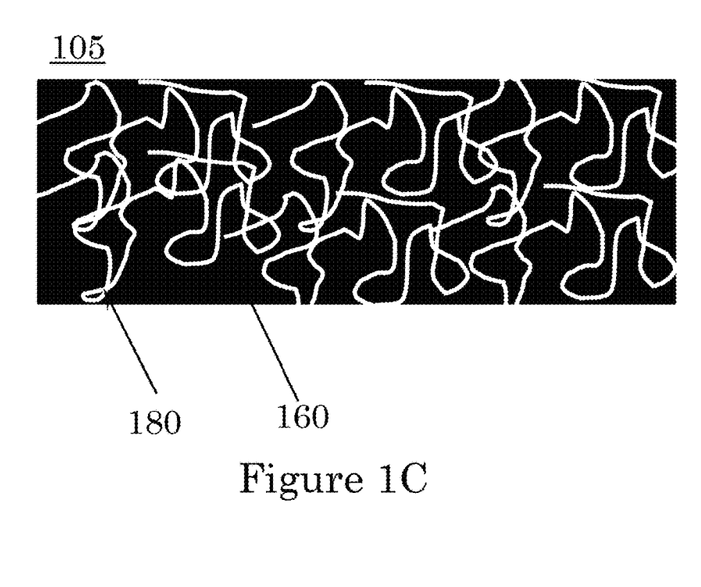
FIG. 1C is a diagram of another exemplary off state white layer comprised of a mesh slab having an interconnected of sub-micron pores filled with a polymer matrix.

FIG. 1C is a diagram of a magnified view of an embodiment of the optically functional porous structure 105, wherein the optically functional porous structure 105 comprises a mesh slab formed of a non-light absorbing material 160 having a plurality of sub-micron pores (not shown), which in this illustration are filled with a polymer matrix 180. In this embodiment, an interconnected network of polymer matrix 180 is formed throughout the mesh slab, having an interface (similar to interface 170 of FIG. 2) between the polymer matrix 180 and the non-light absorbing material 160 of the mesh slab that surrounds it.

Figure 2:
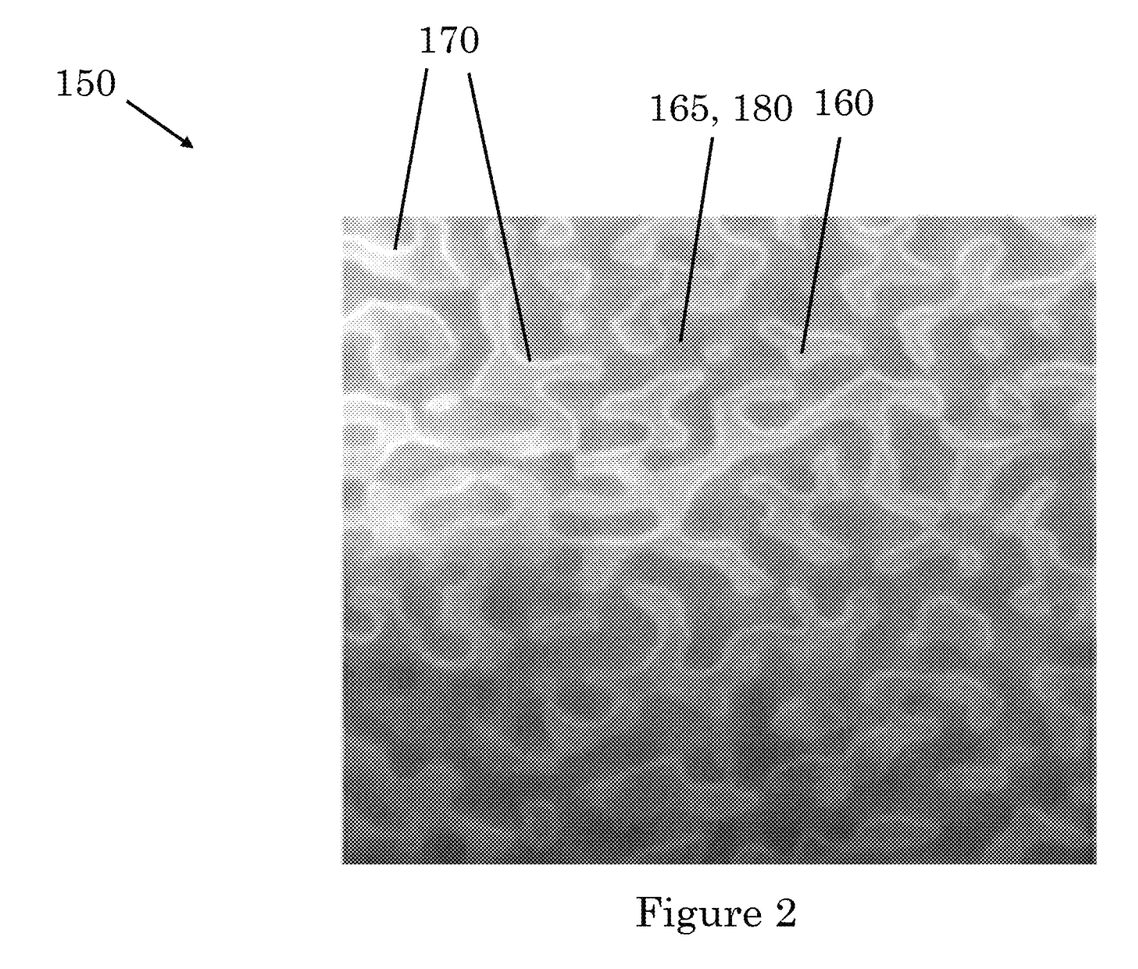
FIG. 2 is a scanning electron micrograph illustration of a cross section of a micron-sized porous glass bead particle comprising sub-micron pores having silicon infused within the sub-micron pores.

FIG. 2 is a scanning electron micrograph illustrating a cross section of an exemplary micron-sized porous particle 150. Dispersed throughout micron-sized porous particle 150 are sub-micron pores 165 surrounded by the non-light absorbing material 160 structure forming an interconnected network within the micron-sized porous particle 150. In this embodiment, the sub-micron pores 165 are filled with a polymer matrix 180. Light that encounters a micron-sized porous particle 150 comprising sub-micron pores 165, will be multiply scattered, not excluding transmission, but limiting it to only a fraction of the light that would otherwise pass through a fully transparent structure. In an embodiment the micron-sized porous particle 150 may be a micron-sized porous glass bead particle.

In an embodiment, the polymer matrix 180 may be any optically functional material, including silicone; a temperature and light resistant matrix, such as an optical grade silicone matrix; or any other suitable material, such as a sol-gel material, an organically modified ceramic (ormocer), or a polysilazane based matrix. In an exemplary embodiment, the polymer matrix 180 may be a high refractive index silicone. Non-limiting examples of silicone may include phenylated silicones (i.e., methylphenyl), and silicones filled with high index nanoparticles.

In an embodiment, the refractive index of the polymer matrix 180 may be greater than the refractive index of the non-light absorbing material 160 of the micron-sized porous particle 150 or the mesh slab network. In an embodiment, the refractive index of the polymer matrix 180 may be less than the refractive index of the non-light absorbing material 160 of the micron-sized porous particle 150 or the mesh slab network. In an embodiment, the polymer matrix is silicone having a refractive index ranging from at least 1.4 to 1.7 at room temperature. In an embodiment, the polymer matrix is silicone having a refractive index ranging from at least 1.46 to 1.56 at room temperature. In an embodiment, silicone has a refractive index ranging from at least 1.50 to 1.56 at room temperature. In an embodiment, the refractive index of the polymer matrix 180 may decrease as the temperature increases. In an embodiment, the refractive index of a silicone at the elevated temperature may decrease and have range from at least 1.46 to a temperature lower than an upper temperature disclosed for the refractive index at room temperature. In an embodiment, the refractive index of the polymer matrix decreases by 0.1 or less at the elevated temperature compared with the refractive index of the polymer matrix at room temperature.

As described in the foregoing, it is not only the refractive index of the material at room temperature that influences what materials should be chosen for the respective layers, but also the coefficient of expansion of the material. For example, solid materials, such as the non-light absorbing material 160 in its final state, have a much lower expansion coefficient, and therefore a much smaller change in refractive index as a function of temperature than silicone for example. Accordingly, changes in temperature have a greater effect on the refractive index of the polymer matrix 180 than on the non-light absorbing materials 160 in the embodiments described herein.

In an embodiment, the micron-sized porous particles 150 may include glass bead particles formed from any material including a porous silica particle or any other suitable material having a refractive index less than the refractive index of the polymer matrix 180. In an exemplary embodiment, the micron-sized porous particle 150 may be a porous silica. A non-limiting example of a non-glass bead micron-sized porous particle 150 is a micron-sized porous magnesium fluoride p article.

The lower limit diameter of the micron-sized porous particles 150 must be large enough to have a sufficient amount material, including the sub-micron pores 165 within such that a sufficient level of light scatter can be achieved. Conversely, the upper limit diameter of the micron-sized porous particles 150 must be small enough to maintain the optically functional layer as thin as possible, In an embodiment the micron-sized porous particle 150 may have a diameter larger than the thickness of optically functional layer. In an embodiment, the micron-sized porous particles 150 may have a diameter in the range of 3 μm to 700 μm. In an embodiment, the micron-sized porous particles 150 may have a diameter in the range of 3 μm to 150 μm. In an embodiment, the micron-sized porous particles 150 may have a diameter in the range 50 μm to 150 μm. In an embodiment, the micron-sized porous particles 150 may have a diameter in the range 3 μm to 50 μm. In an embodiment, the micron-sized porous particles 150 may have a diameter in the range 10 μm to 50 μm. In an embodiment the micron-sized porous particle 150 may have a diameter in the range 10 μm to 100 μm. In an exemplary embodiment the micron-sized porous particle 150 may have a diameter of 50 μm. Notably, the strongest effects may be observed with the largest particles; however, thickness of the optically functional layer 105 must also be considered.

With regard to the packing density of the micron-sized porous particle 150 in the optically functional layer, it is preferably as high as possible to be able to obtain as much scattering as possible in as thin a layer as possible, (where a preferred layer thickness can be 50 μm, up to 100 μm, up to 200 μm, or even greater). In an embodiment, the random packing limit of monodisperse spheres is 64 vol %. If a bimodal distribution is used, the voids between the micron-sized porous particles 150 can be filled up with smaller sized micron-sized porous particles 150, increasing the maximum packing fraction further, for example up to 70% or 80%. In an embodiment, where the micron-sized porous particle 150 used are not monodisperse, or not completely monodisperse, packing volume fractions between 40% and 55% are reached. Lower packing density is also possible, but it will reduce the off state white effect and may also necessitate increasing the layer thickness.

In an embodiment, the size of the sub-micron pore 165 of the micron-sized porous particle 150 may have a diameter in the range of 50 to 400 nm. In an exemplary embodiment the sub-micron pore 165 has a diameter of 200 nm. In an embodiment, the sub-micron pore 165 has a diameter of 100 nm.

In an embodiment, the volume occupied by the sub-micron pores 165 is within the range of approximately 0.6 cm$^3$/gram to 1.5 cm$^3$/gram of the micron-sized porous particle 150. In an embodiment, the volume occupied by the sub-micron pores 165 is within the range of approximately 0.8 cm$^3$/gram to 1.2 cm$^3$/gram of the micron-sized porous particle 150. In an exemplary embodiment, the volume occupied by the sub-micron pores 165 is approximately 0.9 cm$^3$/gram of the micron-sized porous particle 150. The volume occupied by the sub-micron pores 165 within the optically functional porous structure 105 may vary outside of the range provided, depending on at least the materials used and their respective properties, the number of micron-sized porous particles 150 required for optimal light scatter at room temperature, and the integrity of the optically functional porous structure 105.

In an embodiment, and depending on the pore size, the surface area to pore volume may be from approximately 10 m$^2$/gram to 40 m$^2$/gram. The surface area to pore volume occupied by the sub-micron pores 165 within the optically functional porous structure 105 may vary outside of the range provided, depending on at least the materials used and their respective properties, the number of micron-sized porous particles 150 required for optimal light scatter at room temperature, and the integrity of the optically functional porous structure 105.

In an example where the porous non-light absorbing material 160 forms a mesh slab, the non-light absorbing material 160 (as shown in FIG. 1C), the material may be formed from any material including a porous silica particle or any other suitable material having a refractive index less than the refractive index of the polymer matrix 180. For application in an LED, the non-light absorbing material 160 should be stable at high light flux, temperature, and humidity. In an embodiment, inorganic materials are preferred. In an exemplary embodiment, the mesh slab of porous non-light absorbing material 160 may be formed from a porous silica.

Figure 3A:
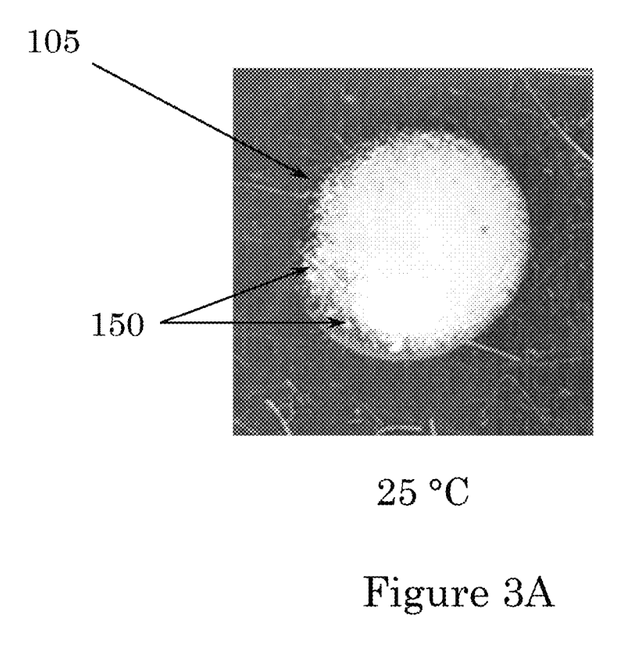
FIG. 3A is an illustration (photograph) of a drop-casted silicone layer loaded with micron-sized porous particles having a diameter of 25-45 μm and comprising sub-micron pores, at 25° C.
Figure 3B:
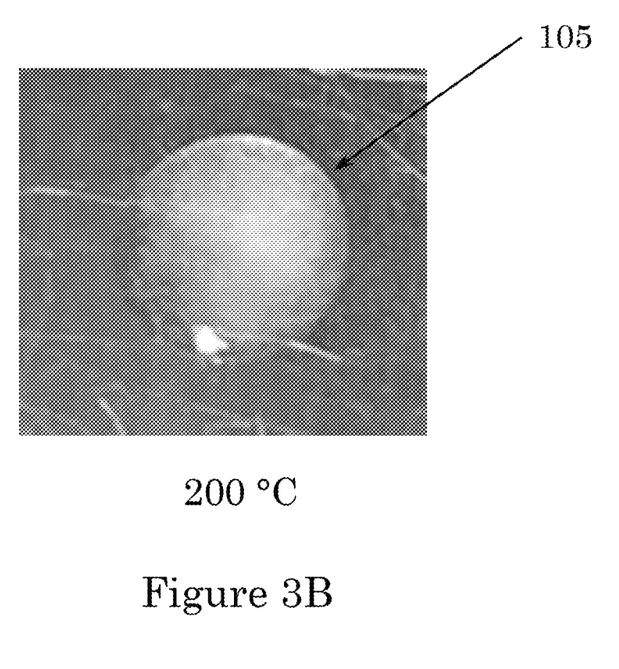
FIG. 3B is an illustration (photograph) of a drop-casted silicone layer loaded with micron-sized porous particles having a diameter of 25-45 μm and comprising sub-micron pores, at 200° C.

FIGS. 3A and 3B are microscopic images of a droplet of the optically functional porous structure 105 comprising of a mixture of silicone as the polymer matrix 180 (as shown in FIGS. 1B and 2) and porous silica as the micron-sized porous particles 150 (also shown in FIGS. 1B and 2). The mixture was prepared by combining a solvent, the silicone, and the porous silica together to form a droplet. Following mixing, the solvent was evaporated and the droplet cured at 150° C. forming an optically functional material 105. Dispersed throughout each droplet of optically functional material 105 are micron-sized porous silica particles whose sub-micron pores 165 (as shown in FIG. 2) are filled with silicone.

The image of FIG. 3A represents the droplet sample at 25° C. The porous silica particles are illustrated by the plurality of small particles within the droplet itself. At this temperature the silicone-loaded porous silica particles scatter white light due at least in part to the differences in the refractive index between porous silica and the silicone filling the sub-micron pores 165 (as shown in FIG. 2).

The image of FIG. 3B represents the droplet sample at 200° C. At this temperature the silicone-loaded porous silica particles scatter less white light than the silicone-loaded porous silica particles observed at 25° C. This is at least in part due to the decrease in the refractive index difference between the refractive index of porous silica and the refractive index of silicone at the elevated temperature.

In an embodiment, the effect of using a silicone having a different refractive index than that of another silicone was assessed keeping temperature constant. Micron-sized porous particles 150 made of porous silica beads having a diameter between 25 μm and 40 μm and an average sub-micron pore size of 200 nm, were dispersed in silicone having a refractive index of 1.56 forming an optically functional layer 200 μm thick having a porous structure that scattered light at 25° C. If a silicone having a refractive index of 1.46, closer to the refractive index of the porous silica, was substituted, there was no detectable light scatter at 25° C. (Data not shown). This effect can at least in part be attributed to the decreased refractive index difference between the materials, wherein the refractive index difference between the materials was approximately zero.

Figure 4:
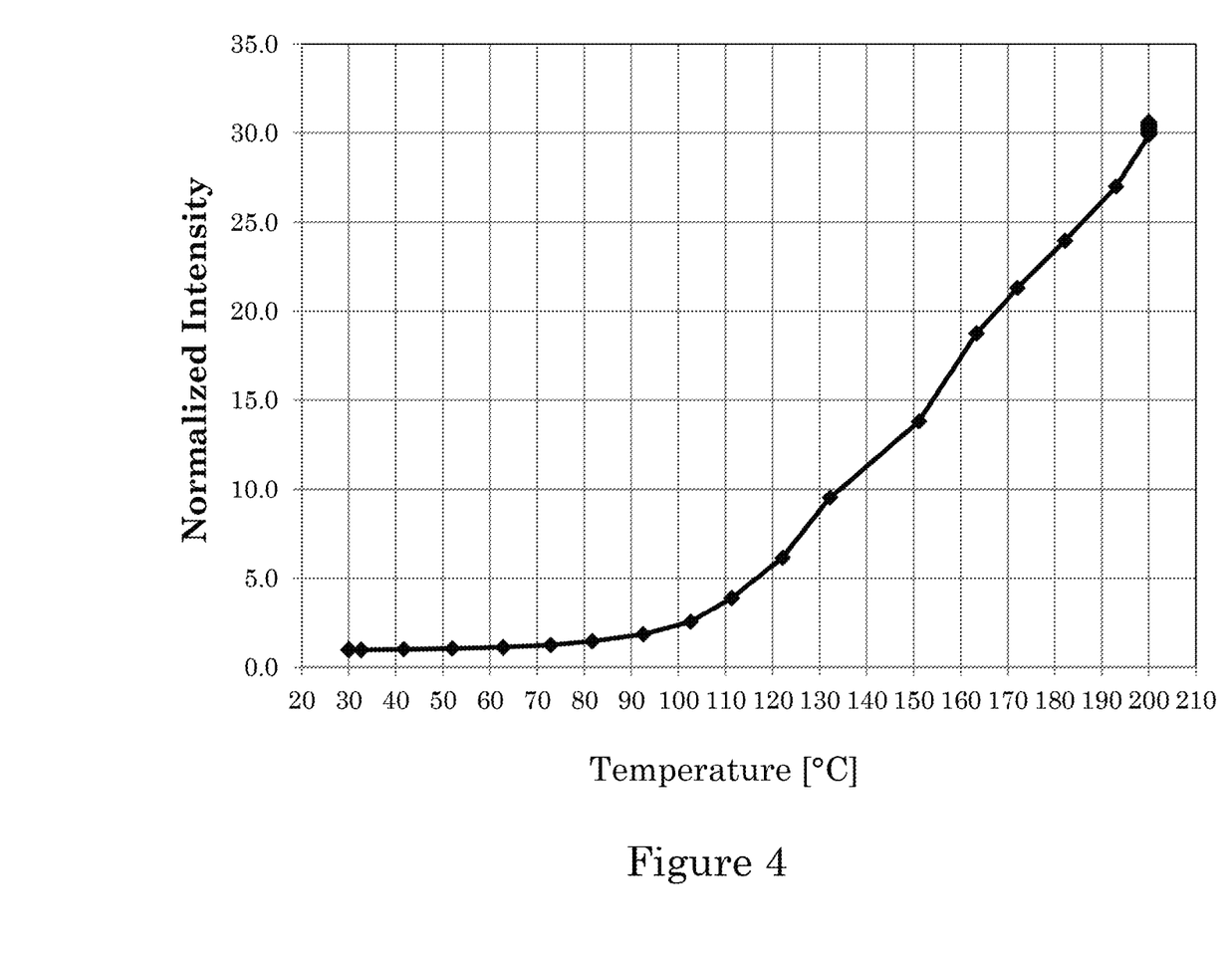
FIG. 4 is a graphical representation of light transmission at 450 nm through a 150 μm layer of high index silicone comprising 25 weight % of 50 μm sized porous silica particles with an effective pore size of 100 nm as a function of temperature.

FIG. 4 illustrates a quantitative assessment of the ability of an optically functional porous structure 105 (as shown in FIGS. 1A, 1B, and 1C), comprising 25 percent by weight porous silica beads having a diameter of 50 μm as the micron-sized porous particles 150. The sub-micron pores 165 (as shown in FIG. 2) of the porous silica beads, having an effective pore size of 100 nm, are filled with a high refractive index silicone as the polymer matrix 180 (as shown in FIGS. 1B and 2), to scatter light as a function of temperature. Direct transmission of light having a wavelength of 450 nm and an intensity of 10 W/cm$^2$ is transmitted through the optically functional porous structure 105 layer comprising the micron-sized porous silica beads distributed throughout, at various temperatures. The intensity of transmitted light detected at each of the temperatures is determined. In an embodiment, the laser spot on the layer is 1.3 mm in diameter and detection of light occurs though the use of an integrating sphere having a 5 mm opening placed approximately 2 cm behind the layer, which is aligned with the 450 nm laser.

The percent of light transmitted through the layer at a first temperature (i.e., 30° C.) is 0.75%. This intensity is determined and normalized against itself to be 1.0 units, as illustrated in FIG. 4. The intensity of transmitted light detected at a second temperature is determined, which is normalized to the intensity of light detected at the first temperature. The intensity of light transmitted is measured for each subsequent temperature that the layer is subjected to and normalized to the intensity of transmitted light detected at the first temperature. As illustrated in FIG. 4, the intensity of light transmitted through the layer increases as the temperature increases such that the intensity of transmitted light is 30-fold higher when the layer is subjected to 200° C. versus the intensity of transmitted light when the layer is subjected to 30° C. Even at temperatures below 200° C. there is an increase in the intensity of transmitted light when the temperature increases above 70° C. to 80° C. For example at 130° C., the intensity of transmitted light through the layer is approximately 10 fold higher that the intensity of light transmitted at 30° C. in this embodiment.

Figure 5:
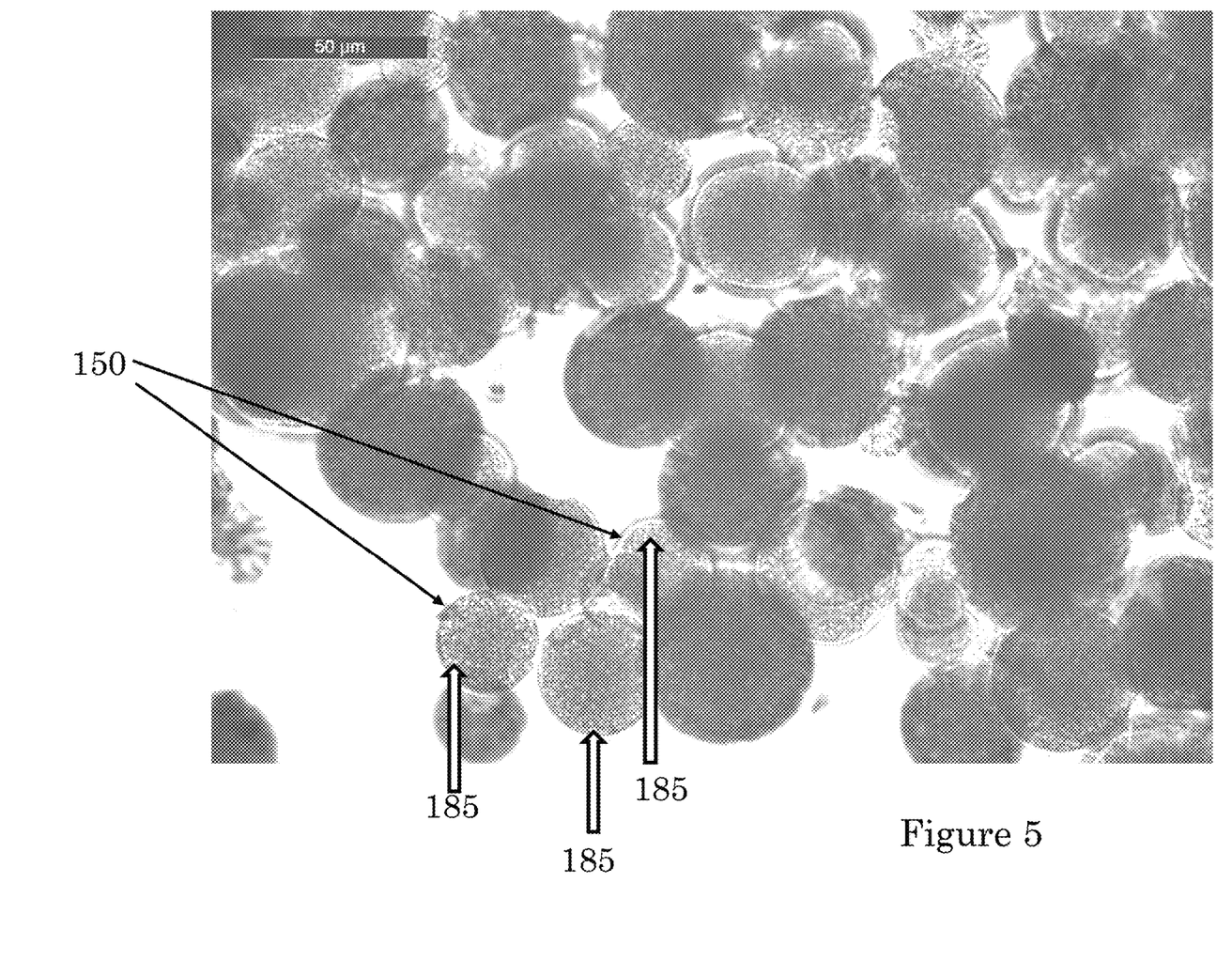
FIG. 5 is a microscopic image of micron-sized porous particles filled with silicone and comprising air voids.

Apart from refractive index changes it is often observed that air voids are present internally in the micron-sized porous particles 150. FIG. 5 is a light microscope image illustrating the presence of air voids 185 (as shown by the wider arrows) within the micron-sized porous particles 150. These are visible under the microscope as an internal structure within the micron-sized porous particles 150.

The air voids 185 also contribute to the scattering of light, from a optically functional layer 105 made with the materials described herein. The air voids 185 can be formed a result of incomplete filling of the sub-micron pores 165 with the polymer matrix 180 (i.e., silicone), but they can also be formed upon curing of the silicone for example, inside the sub-micron pores 165 followed by the subsequent cooling down. When silicone is cured at elevated temperatures (i.e., 150° C.) the silicone expands considerably, because the expansion coefficient is high. As the temperature decreases, the silicone shrinks again, and if insufficient crosslinked silicone can be infused back into the micron-sized porous particles 150 the silicone in the micron-sized porous particles 150 is under stress and may demonstrate local delamination or cohesive failures. When the layer is heated again, for instance by switching on the LED, the silicone expands again and fills up the air voids 185 completely or partially such that the air voids disappear. The net effect is that the switching amplitude in light output between samples at two different temperatures is increased.

As described in the foregoing, the micron-sized porous particles 150 having sub-micron pores 165, or the mesh slab formed of non-light absorbing material 160 and having sub-micron pores, described herein for off state white may be used in other applications. For example, color point regulation, filament lamps, and switchable lenses.

With regard to color point regulation, a color point shift can be observed with an increase in temperature. For example, by increasing the drive current leads, which increases the temperature of the LED, the color point of the LED light can be shifted to cooler light colors. Conversely, by decreasing the drive current leads, which decreases the temperature, the color point of the LED light can be shifted to warmer colors. This is at least in part due to the differing abilities of each color of light to scatter light. For example, blue light is more strongly scattered than red light; therefore, in the layers described in the foregoing, upon an increase in temperature, light scatter decreases such that relatively more blue light is emitted. In this embodiment, the color point shifts to cooler white light. Conversely, upon a decrease in temperature, light scatter increases such that relatively less blue light is emitted. In this embodiment, the color point shifts to warmer white light.

Figure 6:
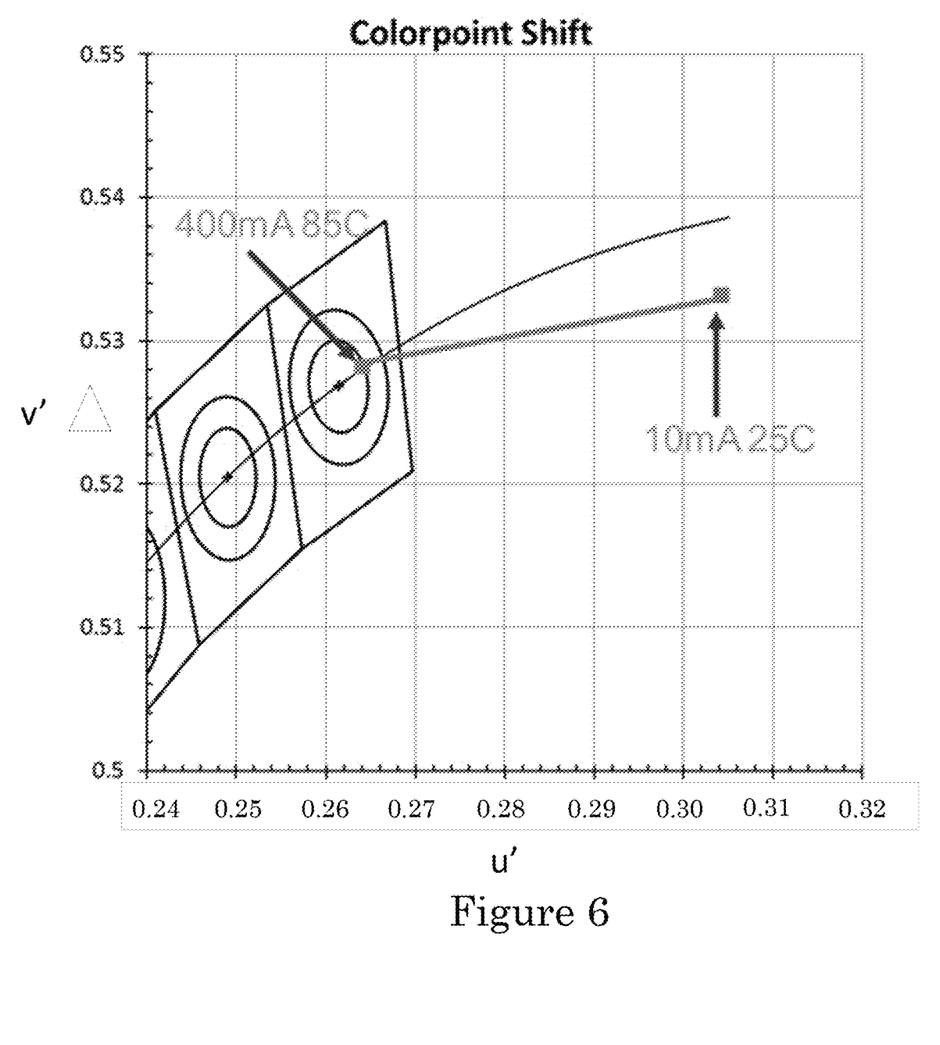
FIG. 6 is a graphical representation illustrating a shift in color point of the light generated from a 1202 COB chip light source whose drive current leads are shifted from 10 mAmp to 400 mAmp, the 1202 COB light source having a cover layer on top comprising micron-sized porous particles having interconnected sub-micron pores filled with a polymer matrix.

In an embodiment, a layer comprising porous silica as the micron-sized porous particles 150 (as shown in FIGS. 1B and 2), dispersed in silicone as the polymer matrix 180 (as shown in FIGS. 1B and 2), was deposited onto a 1202 COB chip, which is a light source that provides bright light and that can be used in place of an LED light source. The 1202 COB chip light comprising the additional layer described herein was subject to drive current leads of 10 mAmp, which was associated with temperatures of about 25° C. When the drive current leads were increased to 400 mAmp, a corresponding increase in temperature to 85° C. occurred. As illustrated in FIG. 6 a color point shift along the u' axis, which is representative of primarily red light color, occurred with a greater amount of red light detected at 25° C. to a lesser amount of red light detected at 85° C.

FIG. 6 also illustrates a relatively smaller shift along the v' axis, which is representative of primarily green light color, when the drive current leads are shifted from 10 mAmp to 400 mAmp. However, not only is the magnitude of the shift along the v' axis less than the magnitude of shift along the u' axis, but the degree to which a change in green light detection will affect warmer versus cooler light is much less than the degree to which an equivalent shift in red light detection will affect warmer versus cooler light.

Although not represented in this illustration, the degree of shift from the generation of more red light to the generation of less red light, which corresponds to a shift from warmer light to cooler light, respectively, is considerably more when the micron-sized porous particle layer comprising porous silica dispersed in silicone is placed over the 1202 COB chip light.

Figure 7:
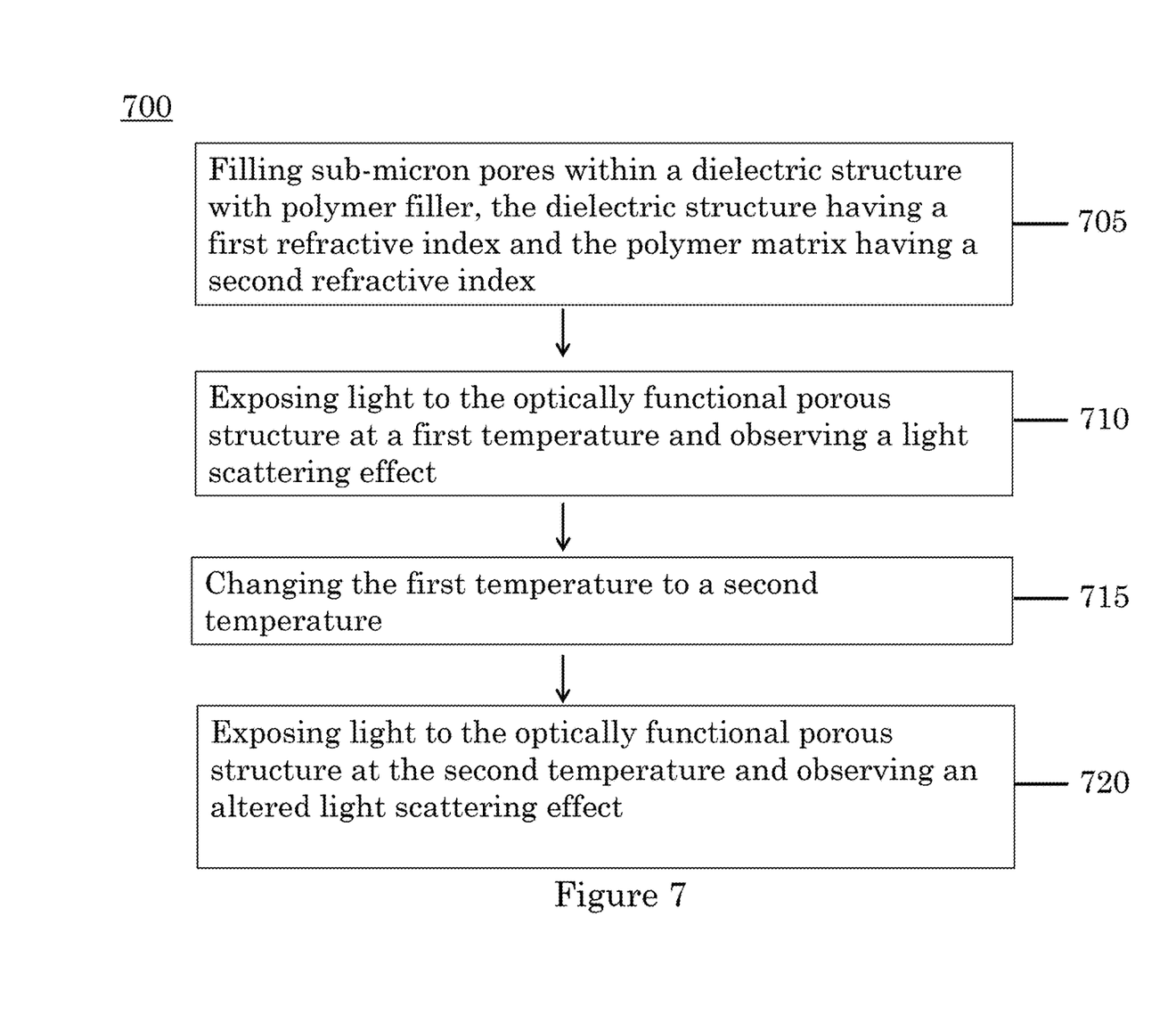
FIG. 7 is a flow diagram of a method of tuning light scattering using an optically functional porous structure.

FIG. 7 is a flow diagram 700 of a method of tuning light scattering using an optically functional porous structure 105 comprising a plurality of sub-micron pores 165 (as shown in FIGS. 1B and 2). In an embodiment, the method 700 includes filling 705 the sub-micron pores 165 (as shown in FIG. 2) formed within the non-light absorbing material 160 (as shown in FIGS. 1B, 1C, and 2), with a polymer matrix 180 (as shown in FIG. 2). In each case the sub-micron pores 165 are filled 705 with the polymer matrix 180 forming an interface 170 (as shown in FIG. 2) between the polymer matrix 180 and the non-light absorbing material 160 in the shape of a sub-micron pore 165. Embodiments of the properties and characteristics of the non-light absorbing material 160, the micron-sized porous particles 150, the mesh slab network, the plurality of sub-micron pores 165, and the polymer matrix 180 have been described in the foregoing. Based on the properties and organizational structure of the materials, light scattering may be tuned using the non-light absorbing material structure 160 comprising the sub-micron sized pores 165 filed with polymer matrix 180 described herein.

Once the sub-micron pores 165 are filled 705 with polymer matrix 180, the optically functional porous structure 105 is exposed to light 710 at the first temperature. Because of the inherent properties and organizational structure of the optically functional porous layer 105, including the refractive index difference between the non-light absorbing material 160 and the polymer matrix filling the sub-micron pores 165, light scattering occurs at the first temperature.

In order to tune, or change the relative amount of light scatter in response to exposure to light, the temperature is changed 715, such that the optically functional porous structure 105 is exposed to light at the second temperature 720. Because the refractive index difference between the non-light absorbing material 160 and the polymer matrix filling the sub-micron pores 165 changes as a function of temperature, the amount of light scattering that occurs at the second temperature changes.

In an embodiment, the refractive index of the polymer matrix 180 decreases as the temperature increases. This results in decreased light scattering, as long as the refractive index of the polymer matrix 180 is greater than that of a non-light absorbing material 160. In an embodiment, $SiO_2$ is the non-light absorbing material 160 that forms the micron-sized porous particles 150 and silicone is used as the polymer matrix 180 that fills the sub-micron pores 165 (as shown in FIG. 2). In this example, the refractive index of the silicone is lower than that of the $SiO_2$; therefore, the refractive index difference between the refractive index of the $SiO_2$ and the refractive index of the silicone would increase with increasing temperature, which would lead to increased light scattering. In an embodiment, the polymer matrix 180 is polydimethylsiloxane (PDMS), a lower refractive index silicone.

In an embodiment, light can be further tuned beyond a refractive index difference through the existence of air voids 185 (as shown in FIG. 5) in the micron-sized porous particles 150 as described herein. As the temperature increases, silicone is cured and expands considerably, because it has a high coefficient of expansion. As the temperature decreases, the silicone shrinks again, and if insufficient crosslinked silicone can be infused back into the micron-sized porous particles 150 air voids 185 may form and the remaining silicone in the micron-sized porous particles 150 is under stress and may demonstrate local delamination or cohesive failures. This, in addition to the refractive index differences between the materials within the micron-sized porous particles 150, may contribute to the scattering of light, from a layer made with the materials described herein. When the layer is heated again, for instance by switching on the LED, the silicone expands again and fills up the air voids 185 completely or partially. The net effect is that the switching amplitude is increased.

In an embodiment, the optically functional porous structure 105 may be used to shift the color point of LED lights during operation, when the LED lights are on as described herein. This may occur as a first temperature of the LED is changed to a second temperature. At the second temperature of the LED, wherein the second temperature is greater than the first temperature, light scattering may decrease, which in this instance would allow for a proportionally greater decrease in light scattering of the blue light versus the red light for example. Because more blue light would be emitted in this instance, the color point of the LED shifts to a cooler white light.

In an embodiment, this method may also be used in other applications, for example, filament lamps and switchable lenses. The method may also be used in applications where an increase in temperature increases the refractive index difference between materials and increases light scatter.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting device comprising:
   a light emitting semiconductor device that in operation emits primary light;
   a wavelength converting structure disposed on the light emitting semiconductor device and configured to absorb at least some of the primary light and in response emit secondary light of longer wavelength than the primary light;
   a porous structure disposed on the wavelength converting structure opposite from the light emitting semiconductor device, formed from a material substantially transparent to the primary and secondary light and having a first index of refraction, and comprising sub-micron pores; and
   a polymer filling the sub-micron pores in the porous structure and having a second index of refraction different from the first index of refraction when compared at 25° C. and when the light emitting device is in an off state at 25° C. the polymer forming optically scattering interfaces with the porous structure that cause the porous structure to appear white to a human observer when the porous structure is under white light external illumination.

2. The light emitting device of claim 1, wherein in operation of the light emitting device secondary light and optionally some of the primary light are transmitted through the porous structure to form an optical output from the light emitting device.

3. The light emitting device of claim 2, wherein the optical output appears white to the human observer.

4. The light emitting device of claim 1, wherein the second index of refraction is greater than the first index of refraction when compared at 25° C.

5. The light emitting device of claim 1, wherein the first index of refraction is greater than the second index of refraction when compared at 25° C.

6. The light emitting device of claim 1, wherein:
   the optically scattering interfaces scatter primary and secondary light;
   a magnitude of a difference between the first index of refraction and the second index of refraction increases as a temperature of the porous structure increases during operation of the light emitting device; and
   a scattering of the primary and secondary light by the optically scattering interfaces consequently increases as the temperature of the porous structure increases during operation of the light emitting device.

7. The light emitting device of claim 1, wherein the porous structure comprises micron-sized particles comprising the sub-micron pores.

8. The light emitting device of claim 7, wherein the micron-sized particles are one of a glass bead particle, a silica particle, and a porous magnesium fluoride particle.

9. The light emitting device of claim 7, wherein the diameter of the micron-sized particles is in a range of 3 µm to 150 µm.

10. The light emitting device of claim 1, wherein the porous structure comprises a mesh slab of porous dielectric material comprising the sub-micron pores.

11. The light emitting device of claim 1, wherein:
    the second index of refraction is greater than the first index of refraction when compared at 25° C.;
    the optically scattering interfaces scatter primary and secondary light;
    a magnitude of a difference between the first index of refraction and the second index of refraction decreases as a temperature of the porous structure increases during operation of the light emitting device; and
    a scattering of the primary and secondary light by the optically scattering interfaces consequently decreases as the temperature of the porous structure increases during operation of the light emitting device.

12. The light emitting device of claim 11, wherein a color point of the optical output shifts to a cooler color as the temperature of the porous structure increases during operation of the light emitting device.

13. The light emitting device of claim 1, wherein:
    the second index of refraction is less than the first index of refraction when compared at 25° C.;
    the optically scattering interfaces scatter primary and secondary light;
    a magnitude of a difference between the first index of refraction and the second index of refraction increases as a temperature of the porous structure increases during operation of the light emitting device; and
    a scattering of the primary and secondary light by the optically scattering interfaces consequently increases as the temperature of the porous structure increases during operation of the light emitting device.

14. The light emitting device of claim 1, wherein the polymer includes one or more substances selected from a group consisting of silicone, a sol-gel, an organically modified ceramic, and a polysilazane.

15. The light emitting device of claim 1, wherein the light emitting semiconductor device in operation emits blue light, and the wavelength converting structure comprises at least one of a yellow emitting wavelength conversion material, a green emitting wavelength conversion material, and a red emitting wavelength conversion material.

16. A light emitting device comprising:
- a light emitting semiconductor device that in operation emits primary light;
- a wavelength converting structure disposed on the light emitting semiconductor device and configured to absorb at least some of the primary light and in response emit secondary light of longer wavelength than the primary light;
- a porous structure disposed on the wavelength converting structure opposite from the light emitting semiconductor device, formed from a material substantially transparent to the primary and secondary light and having a first index of refraction, and comprising sub-micron pores; and
- a polymer filling the sub-micron pores in the porous structure and having a second index of refraction different from the first index of refraction at 25° C., the polymer forming optically scattering interfaces with the porous structure that scatter primary and secondary light, a magnitude of a difference between the first index of refraction and the second index of refraction decreasing with increasing temperature of the porous structure during operation of the light emitting device, and a scattering of the primary and secondary light by the scattering interfaces consequently decreasing with increasing temperature of the porous structure during operation of the light emitting device.

17. The light emitting device of claim 16, wherein:
- in operation of the light emitting device secondary light and optionally some of the primary light are transmitted through the porous structure to form an optical output from the light emitting device;
- the optical output appears white to a human observe; and
- a color point of the optical output shifts to a cooler color as the temperature of the porous structure increases during operation of the light emitting device.

* * * * *